United States Patent [19]
Sponaugle et al.

[11] Patent Number: 5,610,436
[45] Date of Patent: Mar. 11, 1997

[54] SURFACE MOUNT DEVICE WITH COMPENSATION FOR THERMAL EXPANSION EFFECTS

[75] Inventors: Roger Sponaugle, Logan; Robert R. Rainey, North Ogden, both of Utah

[73] Assignee: Bourns, Inc., Riverside, Calif.

[21] Appl. No.: 486,033

[22] Filed: Jun. 7, 1995

[51] Int. Cl.$^6$ .......... H01L 23/495; H01L 23/48; H01L 23/52; H01L 29/40
[52] U.S. Cl. .......... 257/669; 257/666; 257/692; 257/696; 257/773; 257/785; 29/827; 439/513; 361/769
[58] Field of Search .......... 257/666.3, 669, 257/692, 696, 773, 785; 29/827; 439/513; 361/769

[56] References Cited

U.S. PATENT DOCUMENTS

| | | | |
|---|---|---|---|
| 3,719,862 | 3/1973 | Gaicki | 317/234 R |
| 3,877,064 | 4/1975 | Scheingold et al. | 357/74 |
| 4,009,485 | 2/1977 | Koenig | 357/68 |
| 4,529,617 | 6/1986 | Seidler | 339/275 B |
| 4,607,276 | 8/1986 | Butt | 357/79 |
| 4,640,499 | 2/1987 | Hemler et al. | 267/160 |
| 4,647,126 | 3/1987 | Sobota, Jr. | 339/17 CF |
| 4,703,393 | 10/1987 | Yamamoto et al. | 361/405 |
| 4,725,692 | 2/1988 | Ishii et al. | 174/52 FP |
| 4,739,125 | 4/1988 | Watanabe et al. | 174/52 FP |
| 4,802,859 | 2/1989 | Gouldy et al. | 439/74 |
| 4,827,328 | 5/1989 | Ozawa et al. | 257/696 |
| 4,827,611 | 5/1989 | Pai et al. | 29/843 |
| 4,893,172 | 1/1990 | Matsumoto et al. | 257/669 |
| 4,924,292 | 5/1990 | Kaufman | 257/696 |
| 5,096,425 | 3/1992 | Takahashi | 439/55 |
| 5,177,326 | 1/1993 | Goldhammer | 174/52.4 |
| 5,294,039 | 3/1994 | Pai et al. | 228/180.22 |
| 5,317,479 | 5/1994 | Pai et al. | 361/773 |

*Primary Examiner*—Stephen Meier
*Assistant Examiner*—T. M. Arroyo
*Attorney, Agent, or Firm*—Klein & Szekeres, LLP

[57] ABSTRACT

A surface mount electronic device, attachable to a circuit board, comprises an insulating substrate having a top surface and a bottom surface; a plurality of metallized terminal pads on the bottom surface; and a plurality of leads, each attached to one of the terminal pads by a solder column. Each of the leads comprises a first substantially horizontal lead portion attached to one of the terminal pads by the solder column. A plurality of upturned prongs on the first substantially horizontal lead portion forms a pronged area configured to hold the solder column. A second substantially horizontal lead portion terminates in a free end for attachment to the circuit board. An upwardly curved intermediate lead portion connects the first and second substantially horizontal portions and underlies the bottom surface of the substrate. The lead configuration provides compensation for stresses resulting from mismatching temperature coefficients of expansion between the substrate and the circuit board while providing a small "footprint" and a low vertical profile for the device.

20 Claims, 2 Drawing Sheets

SURFACE MOUNT DEVICE WITH COMPENSATION FOR THERMAL EXPANSION EFFECTS

BACKGROUND OF THE INVENTION

This invention relates generally to the field of solid state electronic devices. More specifically, it relates to a lead structure for connecting a "surface mount" electronic device ("SMD") to a circuit board.

Miniature solid state electronic devices configured for surface mounting on a circuit board have become quite common. Devices such as integrated circuits and resistive networks, for example, are frequently packaged and configured as leaded "surface mount devices" or leaded "SMDs". In a leaded "SMD", the terminal leads are flattened and horizontal at their ends, for connection to a termination pad on the surface of the circuit board. This is in contrast to "through-hole" devices, in which the leads are formed as "pins" that extend substantially perpendicular to the bottom surface of the package, so that they may be either inserted through locator holes in the circuit board, or plugged into a socket mounted on the board.

Through-hole devices are frequently made in a "dual in-line package" or "DIP" configuration. In the DIP configuration, the electronic components of the device are encapsulated in a substantially rectangular insulating carrier or package, with a row of leads extending from the two longer sides. Surface-mount devices are frequently made with a similar lead arrangement, although they are not commonly referred to as "DIPs". Nevertheless, for the purpose of this specification, reference to a "DIP" configuration will be deemed to either through-hole or surface-mount devices, as the context requires.

Devices having a DIP configuration usually have a fairly large number of leads, frequently more than eight (four pairs), and sometimes as many as 16 or 20 (eight to ten pairs). Consequently, such devices take up a fair amount of board space. Accordingly, configuring the leads of DIP-type surface mount devices to minimize the area occupied ("footprint") has been an important design consideration, especially where it is desired to optimize the use of limited circuit board space by maximizing component density on its surface.

Another consideration in the design of SMDs is the need to address the effects of thermal coefficient of expansion (TCE) differences between the device and the board. Because the device package and the circuit board are of different materials with different TCEs, changes in ambient temperature result in different degrees of expansion and contraction for the package and the board, thereby resulting in stresses applied to the leads that can damage or crack the leads, or degrade the solder joints by which the leads are attached to the board. Furthermore, a power-on condition can create a thermal gradient across the solder joints from the package to the board. Especially in larger (greater than eight leads) DIP-type leaded SMDs, such thermal gradients will often cause some solder joints to expand more than others, thereby resulting in localized stresses than can degrade the solder joints or crack the leads.

The prior art has sought to address the aforementioned problems. For example, U.S. Pat. No. 4,893,172—Matsumoto et al. discloses an electrical connection assembly for connecting a component to a substrate. The connector assembly comprises a plurality of flat, spring-type contacts connected between the component and the substrate. The leads deform vertically and horizontally in response to a TCE mismatch between the component and the substrate. The spring-type contacts are formed in an insulative sheet placed between the component and the substrate. Aside from possible manufacturing complexities and costs, this arrangement appears best adapted for "leadless" components, and may not be especially well-suited for DIP-configuration SMDs.

U.S. Pat. No. 4,739,125—Watanabe et al. discloses elongated leads for an electronic component package, wherein the leads have an intermediate stepped portion (either horizontal or angled) for thermal stress absorption. The terminal lead-out position from the underside of the component package is shifted toward the center of the package to reduce the footprint. The lead is still soldered to the substrate at a point outside the perimeter of the component, since further inward shifting of the lead-out position could create an instability that would result in the component's "rocking" when vibrated.

U.S. Pat. Nos. 4,592,617—Seidler and 4,647,126—Sobota, Jr. disclose S-shaped leads that clip onto an IC chip or the like so as to make contact with a metallized portion of the chip. The S-shaped configuration provides for the absorption of thermal stresses while minimizing the footprint. The clip attachment mechanism, however, is suitable only for attachment to relatively thin chip substrates, and is not well-adapted for attachment to the underside of a DIP carrier by a solder joint.

U.S. Pat. Nos. 3,877,064—Scheingold et al.; 4,827,611—Pai et al.; 5,294,039—Pai et al.; and 5,317,479—Pai et al. disclose S-shaped leads for attaching leadless chip carriers to a circuit board. While the configuration of the leads reduces thermal stresses, it also results in a footprint that is greater than the area of the chip carrier itself, thereby reducing the potential component density on the board. U.S. Pat. Nos. 4,640,499—Hemler et al. and 5,177,326—Goldhammer disclose arrangements for connecting a leadless chip carrier to a circuit board that allow for thermal effects, but which require specialized fixtures on the board that make these arrangements ill-suited for the typical DIP component.

There has thus been an unfulfilled need for a lead arrangement for DIP-configuration SMDs that allows for the absorption of thermally-induced mechanical stresses, and which minimizes the footprint of the device package on the circuit board. It would be additionally advantageous to proved such a lead arrangement that contributes to the mechanical stability of the device.

SUMMARY OF THE INVENTION

Broadly, the present invention is a lead arrangement for a leaded SMD of the DIP configuration, wherein each lead comprises a first horizontal portion attached to the underside of the substrate of the device package by a solder column, a second horizontal portion configured and located so as to be attachable to a circuit board in surface-mount fashion, and an upwardly curved or "humped" intermediate portion joining the two horizontal portions and underlying the device package. The combination of the humped configuration and the solder column attachment provides sufficient compliance to absorb and compensate for the anticipated mechanical stresses resulting from a TCE mismatch between the device and the circuit board. This compliance is achieved, moreover, with a "footprint" that is within, or just slightly beyond, the perimeter of the device. The "hump" underlying the device package also provides stability to the device, so that the leads can be attached to the package close to its center line, thereby contributing to the small footprint. Furthermore, this lead configuration adds little to the vertical height of the device above the circuit board, thereby creating a "low profile", or low overall height for the device, which is advantageous when adjacent circuit boards are to be "stacked".

In a specific preferred embodiment, the inner end of each lead is formed as an upturned "claw", with a plurality of upturned fingers or prongs that help form and hold the solder column in place against the attachment pads on the underside of the substrate.

Thus it can be seen that the present invention provides a lead arrangement for a DIP-configuration SMD that combines the advantages of good TCE mismatch compensation, small footprint, low device profile, and good device stability. These and other advantages of the invention will be better appreciated from the detailed description that follows.

BRIEF DESCRIPTION OF THE DRAWINGS

FIG. 4 is a bottom plan view of the SMD of FIG. 3; a

DETAILED DESCRIPTION OF A PREFERRED EMBODIMENT

Figure 1:
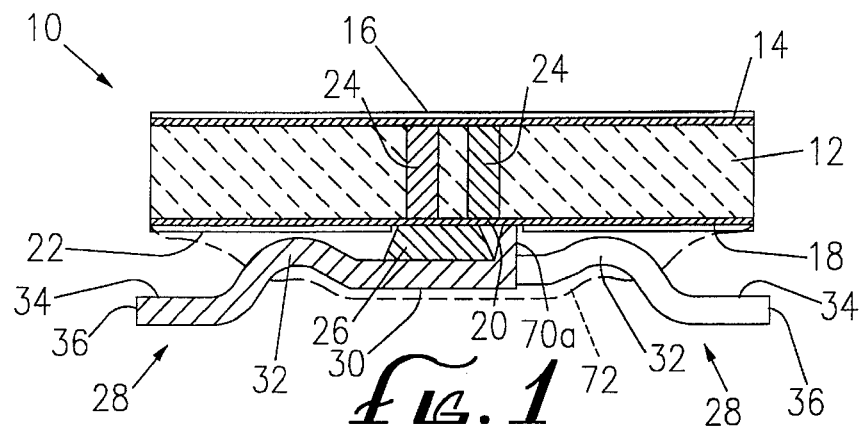
FIG. 1 is a lateral cross-sectional view, taken along line 1—1 of FIG. 2, of an ultra-narrow body DIP-configuration leaded SMD incorporating a preferred embodiment of the present invention.
Figure 2:
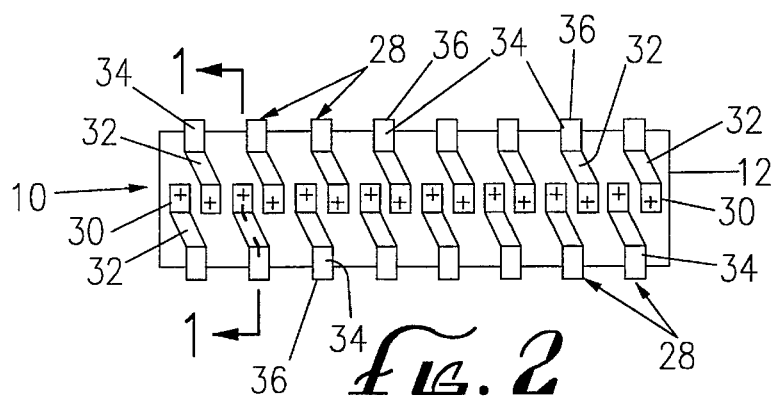
FIG. 2 is a bottom plan view of the SMD of FIG. 1.

Referring first to FIGS. 1 and 2, a leaded surface-mount electronic device (SMD) 10, in an ultra-narrow body dual in-line package (DIP) configuration is shown with a lead arrangement in accordance with a preferred embodiment of the present invention. The device 10 is of conventional construction, comprising an insulative substrate 12 having a first or upper surface having a first or top element layer 14 on its upper surface. The top element layer 14 includes electronic components (not shown) and metallized areas that form conductive paths or traces (not shown), the top element layer 14 being protected by a top insulative overglaze layer 16, as is well-known in the art. The components and conductive paths may be formed by any of several well-known methods, and the type or number of components, the configuration of the traces, and the methods or materials used to form these elements are not critical to the present invention, and are sufficiently conventional so as to need no further description in this specification.

A second or bottom element layer 18 is also provided on the bottom surface of the substrate 12. This bottom element layer 18, like the top element layer 14, may also contain electronic components and traces (not shown), but it also contains an array of metallized termination pads 20. A bottom insulative overglaze layer 22 covers the bottom element layer 18, except for the termination pads 20, the latter being left exposed by the application of a suitable mask during the application of the overglaze material, as is well-known in the art.

To provide conductive paths between the top element layer 14 and the bottom element layer 18, a plurality of through-holes or vias 24 are drilled (as by a laser) through the thickness of the substrate 12. Conductive ink (such as palladium-silver) is drawn through the vias 24 to form the conductive paths.

The present invention is drawn to the configuration and construction of the leads for the above-described device. The ultra-narrow body leaded SMD 10 of FIGS. 1 and 2 includes a single linear array of termination pads 20 arranged substantially along the longitudinal axis of the substrate 12. Attached to each of the termination pads 20 by a solder column 26 is a lead 28, the leads 28 alternating in the side of the substrate 12 to which they are directed, as shown in FIG. 2. Thus, as shown in FIG. 2, a first subset of the plurality of leads 28 is directed to a first side of the substrate 12, and a second subset of the leads 28, alternating with the first subset, is directed toward the second, opposite, side of the substrate 12.

Referring now again to FIG. 1, it is seen that each of the leads 28 includes a first, substantially flat, horizontal inner portion or segment 30 that is connected to its associated termination pad 20 by a solder column 26. Moving outwardly away from the center of the device, each lead 28 has an upwardly-curved intermediate portion 32, followed by a second substantially flat, horizontal outer portion or segment 34, which is configured for connection to a circuit board (not shown), and which terminates in a free end 36. The intermediate portion 32 thus forms an upwardly-directed "hump" which joins the first and second horizontal segments 30, 34, and which underlies the substrate 12. The intermediate portion or hump 32 is advantageously configured so that the second, or outer, horizontal segment 34 is lower than the first horizontal segment 30, while the free end 36 of each lead extends to, or just slightly beyond, the perimeter of the substrate 12.

As shown in FIG. 2, each of the leads 28 is also shaped with a longitudinal offset, created by forming each lead 28 in a "zig-zag" shape, whereby the humped portion 32 of each of the leads 28 defines a diagonal with respect to the longitudinal axis of the substrate 12. The offset allows each pair of alternating leads 28, which are directed toward opposite sides of the substrate 12, to have respective outer horizontal segments 34 and free ends 36 that are in substantial alignment with each other.

The lead arrangement and configuration described above offer a number of advantages. First, the intermediate "hump" 32 in each lead 28 provides an extra length of lead which, in combination with the solder column 26, absorbs and thus compensates for, thermal stresses and strains resulting from a TCE mismatch between the substrate 12 and the circuit board. Second, this thermal stress and strain compensation function is performed without substantially increasing either the "footprint" of the device 10, or the vertical height of the device above the circuit board (its "profile"). Third, the "hump" 32 provides mechanical stability for the device by minimizing the amount of tipping or rocking of the substrate 12 relative to the underlying board due to vibrations, for example, while also allowing the inner ends of the leads 28 to be attached to the substrate 12 approximately along central longitudinal axis thereof, thus further contributing to the small "footprint" of the device 10.

Figure 3:
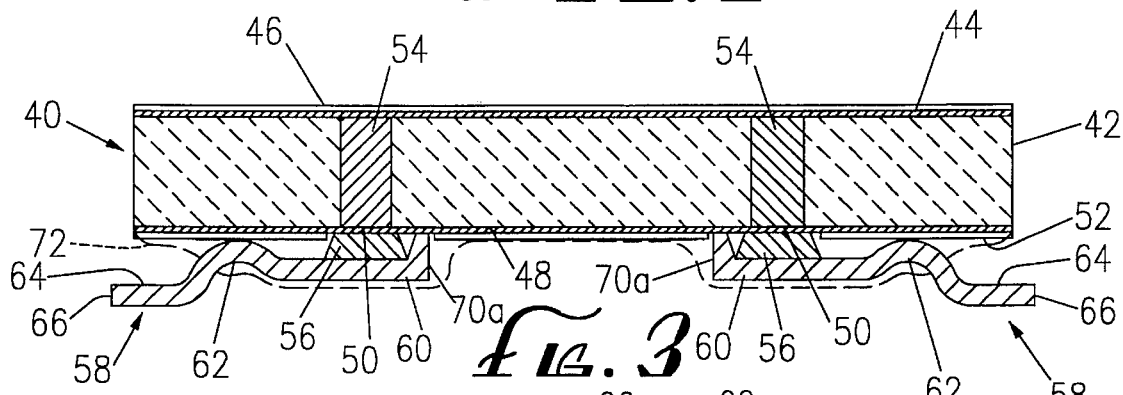
FIG. 3 is a lateral cross-sectional view, taken along line 3—3 of FIG. 4, of a conventional DIP-configuration SMD incorporating a preferred embodiment of the present invention.
Figure 4:
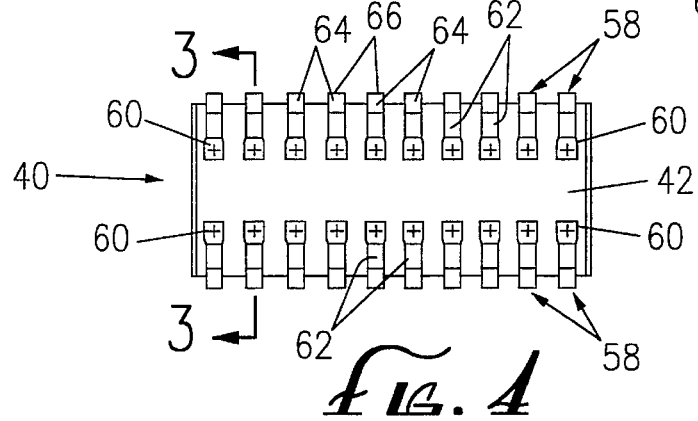

FIGS. 3 and 4 show the present invention incorporated in a leaded SMD 40 of conventional configuration, in which it offers substantially the same advantages as those described above. The device 40 is of similar conventional construction to the ultra-narrow body device of FIGS. 1 and 2, comprising an insulative substrate 42 having a first or upper surface having a first or top element layer 44 on its upper surface. The top element layer 44 includes electronic components (not shown) and metallized areas that form conductive paths or traces (not shown), the top element layer 44 being protected by a top insulative overglaze layer 46.

A second or bottom element layer 48 is also provided on the bottom surface of the substrate 42. This bottom element layer 48, like the top element layer 44, may also contain electronic components and traces (not shown), but it also contains an array of metallized termination pads 50. A bottom insulative overglaze layer 52 covers the bottom element layer 48, except for the termination pads 50, the latter being left exposed by the application of a suitable mask during the application of the overglaze material.

To provide conductive paths between the top element layer 44 and the bottom element layer 48, a plurality of through-holes or vias 54 are drilled (as by a laser) through the thickness of the substrate 42. Conductive ink (such as palladium-silver) is drawn through the vias 54 to form the conductive paths.

The leaded SMD 40 of FIGS. 3 and 4 includes dual parallel linear arrays of termination pads 50 arranged substantially parallel to the longitudinal axis of the substrate 42. Attached to each of the termination pads 50 by a solder column 56 is a lead 58, the leads 58 alternating in the side of the substrate 42 to which they are directed, as shown in FIG. 4. Thus, as shown in FIG. 4, a first subset of the plurality of leads 58 is directed to a first side of the substrate 42, and a second subset of the leads 58, alternating with the first subset, is directed toward the second, opposite, side of the substrate 42.

Referring now again to FIG. 3, it is seen that each of the leads 28 includes a first, substantially flat, horizontal inner portion or segment 60 that is connected to its associated termination pad 50 by a solder column 56. Moving outwardly away from the center of the device, each lead 58 has an upwardly-curved intermediate portion 62, followed by a second substantially flat, horizontal outer portion or segment 64, which is configured for connection to a circuit board (not shown), and which terminates in a free end 66. The intermediate portion 62 thus forms an upwardly-directed "hump" which joins the first and second horizontal segments 60, 64, and which underlies the substrate 42. The intermediate portion or hump 62 is advantageously configured so that the second, or outer, horizontal segment 64 is lower than the first or inner horizontal segment 60, while the free end 66 of each lead extends to, or just slightly beyond, the perimeter of the substrate 42.

In contrast to the leads 28 used on the ultra-narrow body device 10, the leads 58 of the conventional device 40 contain no offset; they extend straight out laterally toward the opposite sides of the substrate 42, substantially perpendicular to the longitudinal axis of the substrate 42.

FIGS. 5 through 8 illustrate the inner portion 30, 60 of one of the leads 28, 58 described above, showing the configuration of the inner portion as an upturned "claw" 68, formed from a plurality of upturned fingers or prongs 70a, 70b, and 70c. As shown in broken outline in FIG. 6, the lead is first formed of a flat metal stamping with a longitudinally-extending end finger 70a and a pair of laterally-extending side fingers 70b, 70c, directed in opposite directions. The fingers 70a, 70b, and 70c are then bent upwardly to form upturned prongs, as shown in solid outline in FIG. 6, as well as in FIGS. 5, 7, and 8. This bending operation is preferably performed while the opposite (outer) end of the lead is still attached to a lead frame carrier strip (not shown).

Figure 5:
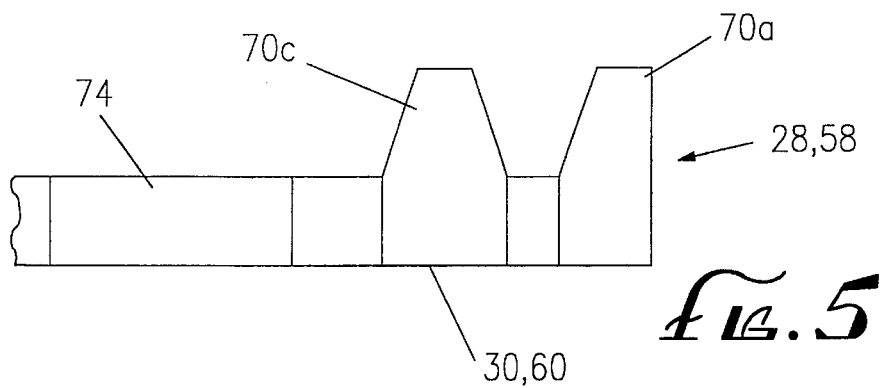
FIG. 5 is a side elevational view of the inner portion of a lead in accordance with preferred embodiment of the present invention, showing the solder-holding prongs of the lead.
Figure 6:
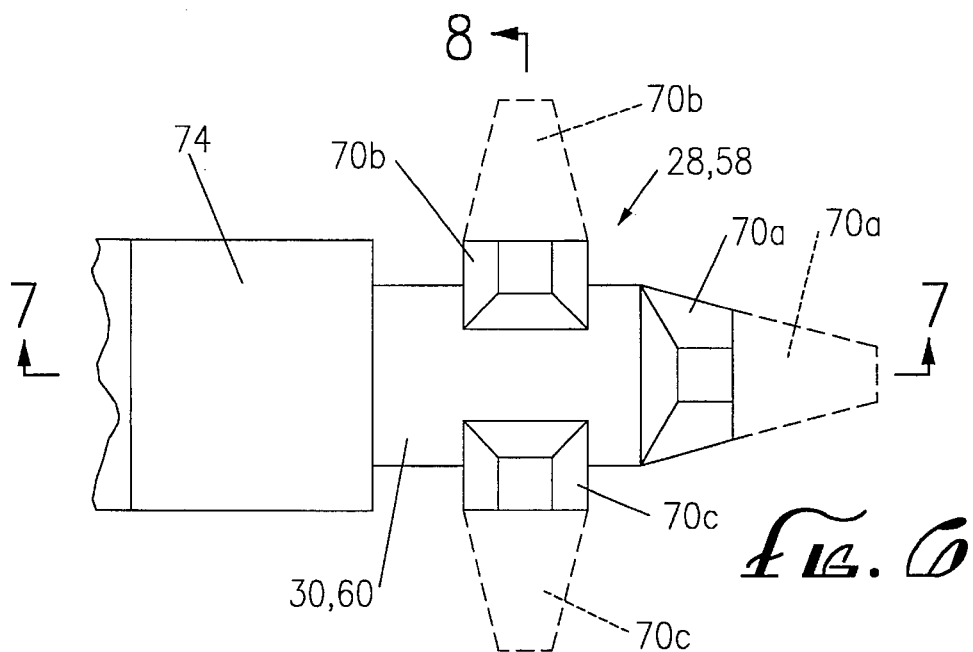
FIG. 6 is a top plan view of the lead portion of FIG. 5.
Figures 7, 8:
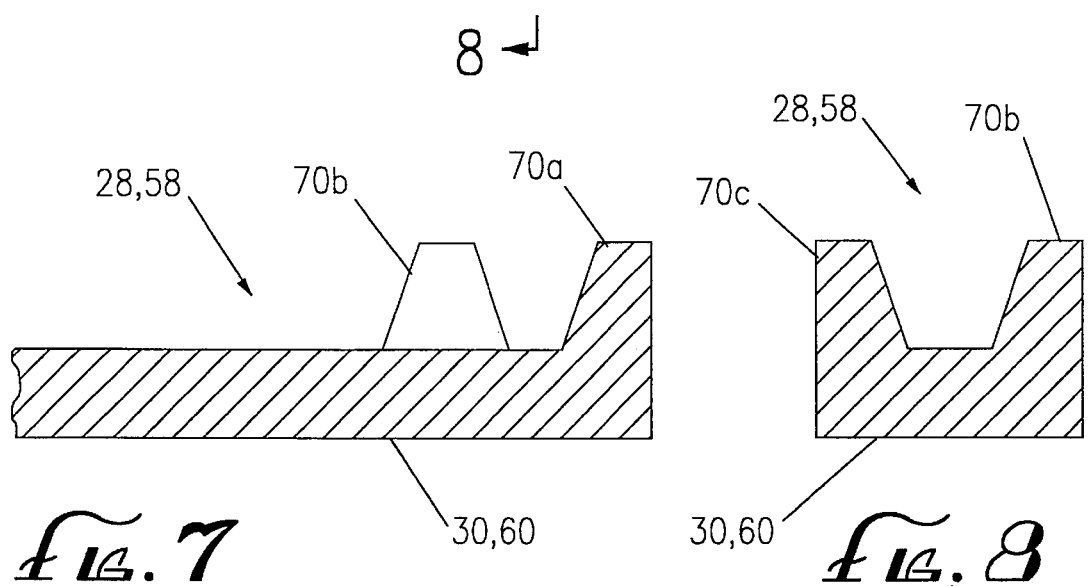
FIG. 7 is a cross-sectional view taken along line 7—7 of FIG. 6.
FIG. 8 is a cross-sectional view taken along line 8—8 of FIG. 6.

After the prongs 70a, 70b, and 70c are formed, the leads 28, 58 must be plated with a solder plate or a solder-accepting material. After plating, a narrow strip of plating is removed, leaving an unplated area 74 adjacent the pronged area, as shown in FIGS. 5 and 6. The unplated area 74 prevents the wicking of solder from the solder column and the pronged area during the lead attachment process. Formation of the solder columns 26, 56 is accomplished by the addition of sufficient solder to the pronged area to form the solder columns 26, 56 for attachment to the substrate. The solder may be added in any of several ways. Three ways are preferred: (1) The pronged area may be dipped in a bath of melted solder, allowing surface tension and wicking to form a volume of solder around and between the prongs 70a, 70b, 70c. (2) A solid piece of solder may be placed in the prong area, and the prongs 70a, 70b, 70c bent toward each other to capture the solder piece between them. (3) Solder cream may be dispensed onto the substrate terminal pads 20, 50.

Attachment of the leads to the terminal pads 20, 50 on the substrates 12, 42, respectively is accomplished by fixing the substrate and leadframe in a soldering fixture to provide contact between the pronged end of each of the leads and its associated terminal pad. Heat is applied to reflow the solder, which has been provided by one of the methods described above. During reflow, the ends of the prongs 70a, 70b, 70c are brought very close to, or in actual contact with, the substrate, either by the prepositioning of the soldering fixture, or by the application of force, or by the surface tension of the solder, or by any desired combination of these processes. While the solder is in its flowable state, the prongs 70a, 70b, 70c form a path to promote the formation of a solder column 26, 56 between the substrate and the inner end of the lead. After the reflowing is completed, the assembly (the SMD with leads attached) is cooled to solidify the solder.

Alternatively, rather than adding the solder to the leadframe or the terminal pads and then creating the solder connection by reflowing, the fixtured substrate and leadframe may be passed through a wave solder operation, by which solder is added and the solder joint is formed in a single operation. For this operation, a conventional solder mask (either oxide or organic) would have to be applied to the unplated lead areas 74 to maintain their aforesaid function.

After the leads are attached to the substrate as described above, the carrier strip is excised from the lead frame, as is well-known in the art, to create the free ends 36, 66 of the leads 28, 58, respectively. A resin matrix encapsulant 72 (FIGS. 1 and 3) may be applied to the underside of the substrate, either before or after the carrier strip is removed, for the environmental protection and insulation of the lead connections. For a device having an alumina substrate, with copper leads, soldered to a glass/epoxy circuit board, the encapsulant 72 should have a modulus of elasticity in the range of about 1,000 to about 20,000 psi, with a temperature coefficient of expansion (TCE) in the range of about $30 \times 10^{-6}$/° C. to about $50 \times 10^{-6}$/° C. In selecting an encapsulant material for the purposes of this invention, these two parameters would have an inverse relationship. Thus, the higher the modulus of elasticity, the lower the TCE required in the encapsulant material, and vice versa. More specifically, a TCE close to the upper limit set forth above would most likely require a modulus of elasticity below about 5,000 psi, while a modulus of elasticity above about 10,000 psi would most likely require a TCE close to the lower limit set forth above.

Although a preferred embodiment of the invention has been described above, several modifications and variations will suggest themselves to those skilled in the pertinent arts. For example, rather than have the "humped" portion of the lead formed as an arcuate curve, as shown in the drawings, it may be advantageous, in some applications, to form the "humped" portion as a series of linear segments, whereby the uppermost portion of each lead, that is, the portion closest to the bottom surface of the substrate, is a short, substantially horizontal segment, joined at either end to the first and second horizontal portions by short, linear, diagonal links. Thus, for the purposes of this disclosure, the terms "upwardly-curved" and "humped" should be interpreted as encompassing both the preferred arcuate configuration and the alternative linear-segmented configuration. Such variations, and others that may suggest themselves to those skilled in the pertinent arts, are considered within the spirit and scope of the invention, as defined in the claims that follow.

What is claimed is:

1. An electronic device that is attachable to a circuit board, the device comprising:

an insulating substrate having a top surface and a bottom surface;

a plurality of metallized terminal pads on the bottom surface; and a plurality of leads, each attached to one of the terminal pads, each of the leads comprising:

a first substantially horizontal lead portion attached to one of the terminal pads;

a second substantially horizontal lead portion configured for attachment to the circuit board and terminating in a free end, a substantial part of the length of the second lead portion underlying the bottom surface of the substrate; and an upwardly curved intermediate lead portion connecting the first and second substantially horizontal portions, the intermediate lead portion including an upwardly-curved hump that underlies and is curved toward the bottom surface of the substrate so as to inhibit the tipping of the substrate relative to the circuit board.

2. The electronic device of claim 1, wherein the first substantially horizontal lead portion of at least some of the leads is attached to an associated one of the terminal pads by a solder column.

3. The electronic device of claim 1, wherein the substrate has a longitudinal axis, and wherein the plurality of terminal pads is arranged in a row that is substantially aligned along the longitudinal axis.

4. The electronic device of claim 1, wherein the substrate has a longitudinal axis, and wherein the plurality of terminal pads is arranged in a pair of rows on either side of the longitudinal axis and substantially parallel thereto.

5. The electronic device of claim 3, wherein the first substantially horizontal lead portion of at least some of the leads is attached to an associated one of the terminal pads by a solder column.

6. The electronic device of claim 4, wherein the first substantially horizontal lead portion of at least some of the leads is attached to an associated one of the terminal pads by a solder column.

7. The electronic device of claim 3, wherein the upwardly-curved portion of at least some of the leads defines a diagonal with respect to the longitudinal axis.

8. The electronic device of claim 7, wherein the substrate includes first and second opposite sides, wherein the leads are disposed in a plurality of pairs, the leads in each pair being directed toward the opposite sides of the substrate, and wherein the leads in each pair have respective second substantially horizontal portions that are in substantial alignment with each other.

9. The electronic device of claim 5, wherein the upwardly-curved portion of at least some of the leads defines a diagonal with respect to the longitudinal axis.

10. The electronic device of claim 9, wherein the substrate includes first and second opposite sides, wherein the leads are disposed in a plurality of pairs, the leads in each pair being directed toward the opposite sides of the substrate, and wherein the leads in each pair have respective second substantially horizontal portions that are in substantial alignment with each other.

11. The electronic device of claim 4, wherein at least some of the leads extend substantially perpendicularly to the longitudinal axis of the substrate.

12. The electronic device of claim 6, wherein at least some of the leads extend substantially perpendicularly to the longitudinal axis of the substrate.

13. The electronic device of claim 2, wherein the first substantially horizontal portion includes a plurality of upturned prongs forming a pronged area in which the solder column is held.

14. A conductive lead for attachment to a circuit board and to a metallized area on a bottom surface of a substrate by a solder column, comprising:

a first substantially horizontal lead portion;

a plurality of upturned prongs on the first substantially horizontal lead portion forming a pronged area configured to hold the solder column;

a second substantially horizontal lead portion configured for attachment to the circuit board and terminating in a free end, a substantial part of the length of the second lead portion underlying the bottom surface of the substrate; and an upwardly curved intermediate lead portion connecting the first and second substantially horizontal lead portions, the intermediate lead portion including an upwardly-curved hump that underlies and is curved toward the bottom surface of the substrate so as to inhibit the tipping of the substrate relative to the circuit board.

15. An electronic device that is attachable to a circuit board, the device comprising:

an insulating substrate having a top surface and a bottom surface;

a plurality of metallized terminal pads on the bottom surface; and a plurality of leads, each attached to one of the terminal pads by a solder column, each of the leads comprising:

a first substantially horizontal lead portion;

a plurality of upturned prongs on the first substantially horizontal lead portion forming a pronged area configured to hold the solder column;

a second substantially horizontal lead portion configured for attachment to the circuit board and terminating in a free end, a substantial part of the length of the second lead portion underlying the bottom surface of the substrate; and an upwardly curved intermediate lead portion connecting the first and second substantially horizontal portions, the intermediate lead portion including an upwardly-curved hump that underlies and is curved toward the bottom surface of the substrate so as to inhibit the tipping of the substrate relative to the circuit board.

16. The electronic device of claim 15, wherein the substrate has a longitudinal axis, and wherein the plurality of terminal pads is arranged in a row that is substantially aligned along the longitudinal axis.

17. The electronic device of claim 15, wherein the substrate has a longitudinal axis, and wherein the plurality of terminal pads is arranged in a pair of rows on either side of the longitudinal axis and substantially parallel thereto.

18. The electronic device of claim 16, wherein the upwardly-curved portion of at least some of the leads defines a diagonal with respect to the longitudinal axis.

19. The electronic device of claim 18, wherein the substrate includes first and second opposite sides, wherein the leads are disposed in a plurality of pairs, the leads in each pair being directed toward the opposite sides of the substrate, and wherein the leads in each pair have respective second substantially horizontal portions that are in substantial alignment with each other.

20. The electronic device of claim 17, wherein at least some of the leads extend substantially perpendicularly to the longitudinal axis of the substrate.

* * * * *